United States Patent
Yu et al.

(10) Patent No.: US 12,525,514 B2
(45) Date of Patent: Jan. 13, 2026

(54) PACKAGE STRUCTURE WITH AT LEAST TWO DIES AND AT LEAST ONE SPACER

(71) Applicant: CHINGIS TECHNOLOGY CORPORATION, Hsinchu (TW)

(72) Inventors: Cheng-Fu Yu, Milpitas, CA (US); Kai-Jih Shih, Milpitas, CA (US); Chi-Yi Wu, Milpitas, CA (US)

(73) Assignee: CHINGIS TECHNOLOGY CORPORATION, Hsinchu (TW)

( * ) Notice: Subject to any disclaimer, the term of this patent is extended or adjusted under 35 U.S.C. 154(b) by 599 days.

(21) Appl. No.: 18/052,234

(22) Filed: Nov. 3, 2022

(65) Prior Publication Data

US 2024/0047313 A1  Feb. 8, 2024

(30) Foreign Application Priority Data

Aug. 2, 2022 (TW) .................................. 111129040

(51) Int. Cl.
*H01L 23/495* (2006.01)
*H01L 23/00* (2006.01)
(Continued)

(52) U.S. Cl.
CPC ...... *H01L 23/49541* (2013.01); *H01L 23/293* (2013.01); *H01L 23/3107* (2013.01); *H01L 23/49503* (2013.01); *H01L 23/49582* (2013.01); *H01L 24/48* (2013.01); *H01L 24/49* (2013.01); *H01L 25/0655* (2013.01); *H01L 2224/48011* (2013.01); *H01L 2224/48091* (2013.01); *H01L 2224/48101* (2013.01); *H01L 2224/48137* (2013.01); *H01L 2224/48257* (2013.01); *H01L 2224/4903* (2013.01); *H01L 2224/49052* (2013.01); *H01L 2224/49175* (2013.01); *H01L 2924/1811* (2013.01); *H01L 2924/1815* (2013.01); *H01L 2924/182* (2013.01)

(58) Field of Classification Search
CPC ................................................... H01L 23/49541
USPC ........................................................... 257/666
See application file for complete search history.

(56) References Cited

U.S. PATENT DOCUMENTS

| | | | |
|---|---|---|---|
| 6,930,378 B1 * | 8/2005 | St. Amand | H01L 25/0657 257/691 |
| 2016/0056092 A1 * | 2/2016 | Otremba | H01L 21/4828 257/676 |

(Continued)

FOREIGN PATENT DOCUMENTS

| | | | |
|---|---|---|---|
| TW | 200638526 A | | 11/2006 |
| TW | M633251 U | * | 10/2022 |

*Primary Examiner* — Ajay Arora
(74) *Attorney, Agent, or Firm* — McClure, Qualey & Rodack, LLP

(57) ABSTRACT

A package structure includes a leadframe, at least two dies, at least one spacer and a plastic package material. The leadframe includes a die pad. The dies are disposed on the die pad of the leadframe. The spacer is disposed between at least one of the dies and the die pad. The plastic package material is disposed on the leadframe, and covers the dies. A first minimum spacing distance is between one of a plurality of edges of the spacer and one of a plurality of edges of the die pad, a second minimum spacing distance is between one of a plurality of edges of the dies and one of the edges of the die pad, and the first minimum spacing distance is larger than the second minimum spacing distance.

7 Claims, 11 Drawing Sheets

(51) Int. Cl.
*H01L 23/29* (2006.01)
*H01L 23/31* (2006.01)
*H01L 25/065* (2023.01)

(56) References Cited

U.S. PATENT DOCUMENTS

| | | | |
|---|---|---|---|
| 2021/0407929 A1* | 12/2021 | Jeon | H01L 25/50 |
| 2023/0246000 A1* | 8/2023 | Shen | H01L 24/48 |
| | | | 257/676 |

* cited by examiner

PACKAGE STRUCTURE WITH AT LEAST TWO DIES AND AT LEAST ONE SPACER

RELATED APPLICATIONS

This application claims priority to Taiwan Application Serial Number 111129040, filed Aug. 2, 2022 and Taiwan Application Serial Number 111208331, filed Aug. 2, 2022, which are herein incorporated by references.

BACKGROUND

Technical Field

The present disclosure relates to a package structure. More particularly, the present disclosure relates to a package structure, which can increase the contacting area between the plastic package material and the die pad to obtain the sufficient contacting area.

Description of Related Art

In the semiconductor packaging industry nowadays, the volume of the package structure is gradually reduced according to the technical development, wherein the volume of the package structure is reduced by reducing the area of the die pad of the leadframe and the area of the die. However, the excessively close distance between the edge of the die and the edge of the die pad is caused under the condition of reducing the area of the die pad, that is, the insufficient distance between the edge of the die pad and the edge of the die, so that the contacting area between the plastic package material and the die pad is insufficient. Hence, the defect of serious delamination of the plastic package material is easily formed on the edge of the die pad when the package structure is stressed.

Therefore, a package structure, which can reduce the risk of the delamination of the plastic package material under stressed, needs to be developed.

SUMMARY

According to one aspect of the present disclosure, a package structure includes a leadframe, at least two dies, at least one spacer and a plastic package material. The leadframe includes a die pad. The dies are disposed on the die pad of the leadframe. The spacer is disposed between at least one of the dies and the die pad. The plastic package material is disposed on the leadframe, and covers the dies. A first minimum spacing distance is between one of a plurality of edges of the spacer and one of a plurality of edges of the die pad, a second minimum spacing distance is between one of a plurality of edges of the dies and one of the edges of the die pad, and the first minimum spacing distance is larger than the second minimum spacing distance.

According to one aspect of the present disclosure, a package structure includes a leadframe, a die, a spacer and a plastic package material. The leadframe includes a die pad. The die is disposed on the die pad of the leadframe. The spacer is disposed between the die and the die pad. The plastic package material is disposed on the leadframe, and covers the die. An area of the spacer is less than an area of the die.

DETAILED DESCRIPTION

Figure 1:
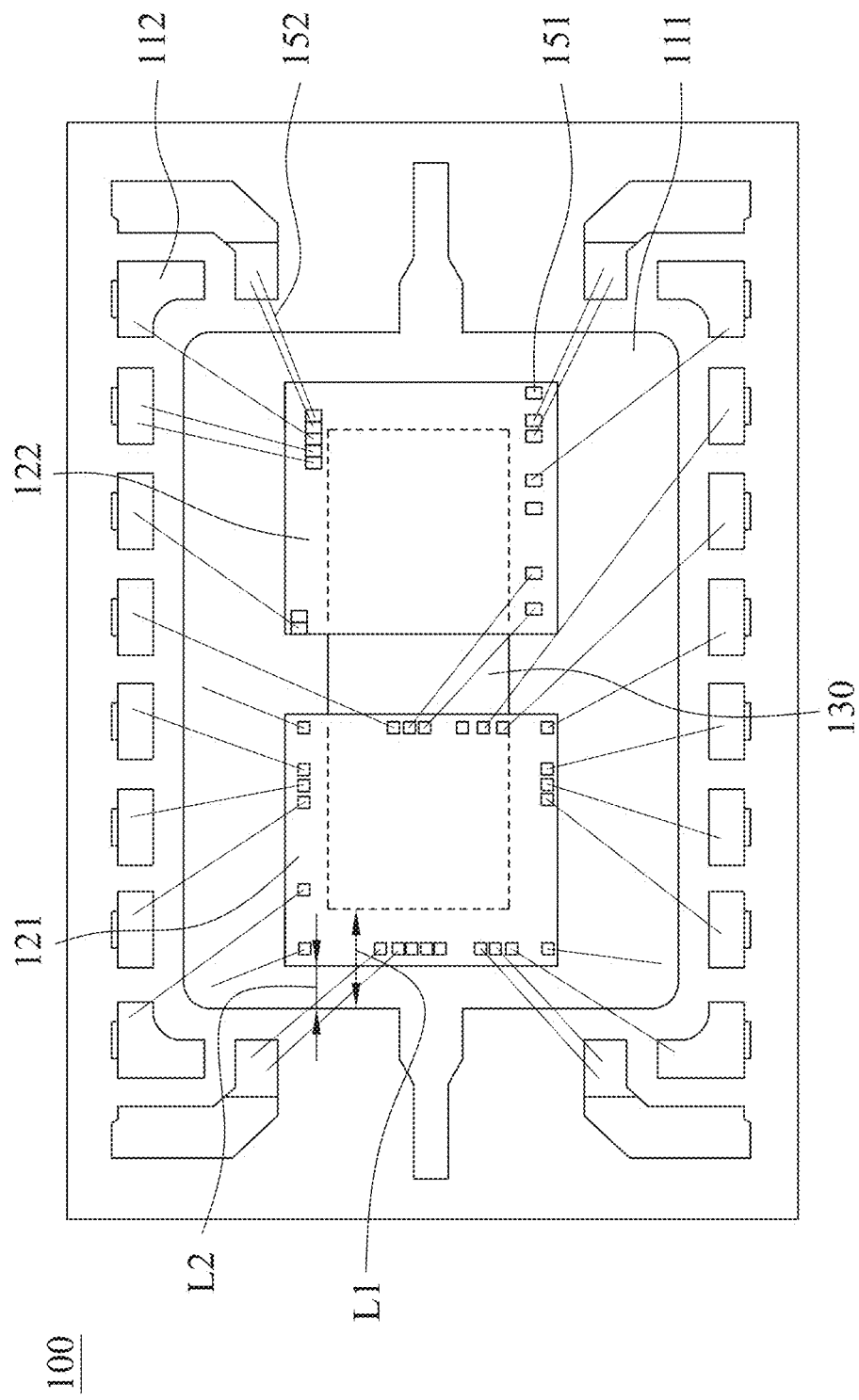
FIG. 1 is a plane schematic view of a package structure according to the 1st embodiment of the present disclosure.
Figure 2:
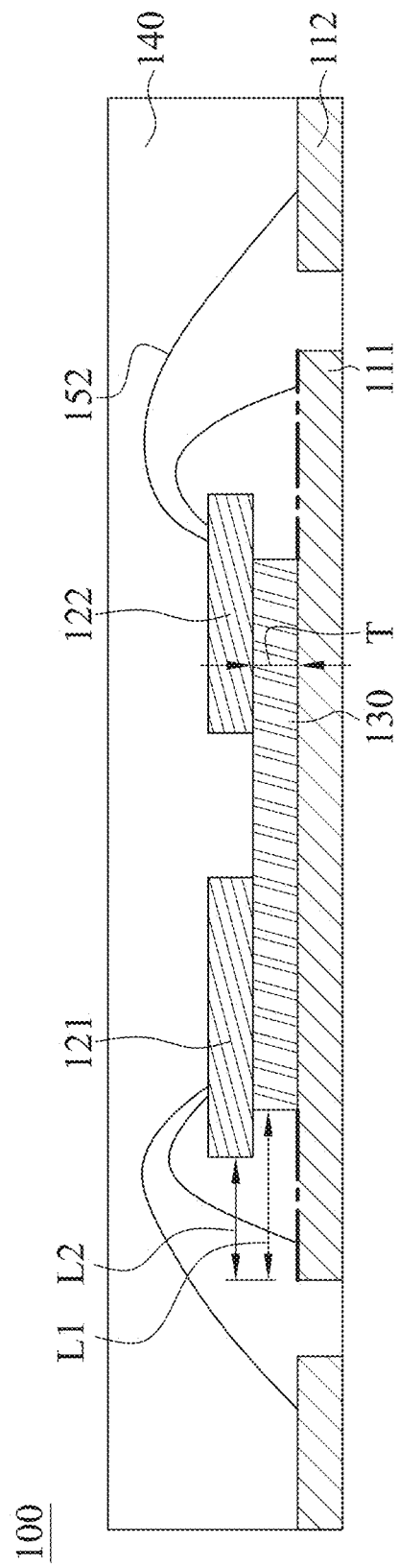
FIG. 2 is a cross-sectional view of the package structure according to the 1st embodiment in FIG. 1.

FIG. 1 is a plane schematic view of a package structure 100 according to the 1st embodiment of the present disclosure. FIG. 2 is a cross-sectional view of the package structure 100 according to the 1st embodiment in FIG. 1. In FIGS. 1 and 2, the package structure 100 includes a leadframe (its reference numeral is omitted), two dies 121, 122, a spacer 130 and a plastic package material 140, wherein the plastic package material 140 is disposed on the leadframe, and covers the dies 121, 122.

Furthermore, the leadframe includes a die pad 111 and a plurality of leads 112, and each of the dies 121, 122 includes a plurality of pads 151, wherein the dies 121, 122 are disposed on the die pad 111, a plurality of conducting wires 152 are connected to the leads 112 and the pads 151, and the spacer 130 is simultaneously disposed between the dies 121, 122 and the die pad 111.

A first minimum spacing distance L1 is between one of a plurality of edges of the spacer 130 and one of a plurality of edges of the die pad 111, and a second minimum spacing distance L2 is between one of a plurality of edges of the dies 121, 122 and one of the edges of the die pad 111, wherein the first minimum spacing distance L1 is larger than the second minimum spacing distance L2, and the first minimum spacing distance L1 can be at least 40 micrometers. According to the 1st embodiment, the second minimum spacing distance L2 is located between one of the edges of the die 121 and one of the edges of the die pad 111. Therefore, when the dies 121, 122 are horizontally arranged on the die pad 111, the risk of the delamination of the plastic package material 140 under the stressed condition of the package structure 100 can be reduced by the sufficient contacting area between the plastic package material 140 and the die pad 111, wherein the contacting area which is increased via the spacer 130 is shown as the thick chain line in FIG. 2. Moreover, an area of the spacer 130 can be less than a total area of the dies 121, 122, and an area of the die 121 can be different from an area of the die 122.

Further, the disposing flexibility of the dies 121, 122 can be increased via the spacer 130, that is, the disposition of the dies 121, 122 is not limited to the area of the die pad 111, so as to increase the flexibility of design of the package structure 100, especially the condition that the larger area of the dies are disposed on the smaller volume of the package structure. Moreover, the effect of protecting the dies 121, 122 can be obtained via the spacer 130, so as to avoid the damaging condition of the dies 121, 122 during the external stress striking the package structure 100.

In detail, a thickness T of the spacer 130 can be larger than or equal to 40 micrometers, and less than or equal to 500 micrometers. When the thickness T of the spacer 130 is less than the aforementioned value range, the effect of obtaining the sufficient contacting area between the plastic package material 140 and the die pad 111 cannot achieved via the spacer 130; when the thickness T of the spacer 130 is larger than the aforementioned value range, the problem of over the standard thickness of the package structure 100 may be caused, or the risk of the conducting wires 152 excessively close to the surface of the plastic package material 140 may be caused.

The spacer 130 can be made of silicon. In particular, the spacer 130 can be the blank wafer made of silicon, but the present disclosure is not limited thereto.

Furthermore, the package structure 100 according to the 1st embodiment is the package type of QFN, but the package structure of the present disclosure cannot only be applied to the package type of QFN, but also the package type of TSOP, SO, QFP, but the present disclosure is not limited thereto.

Figure 3:
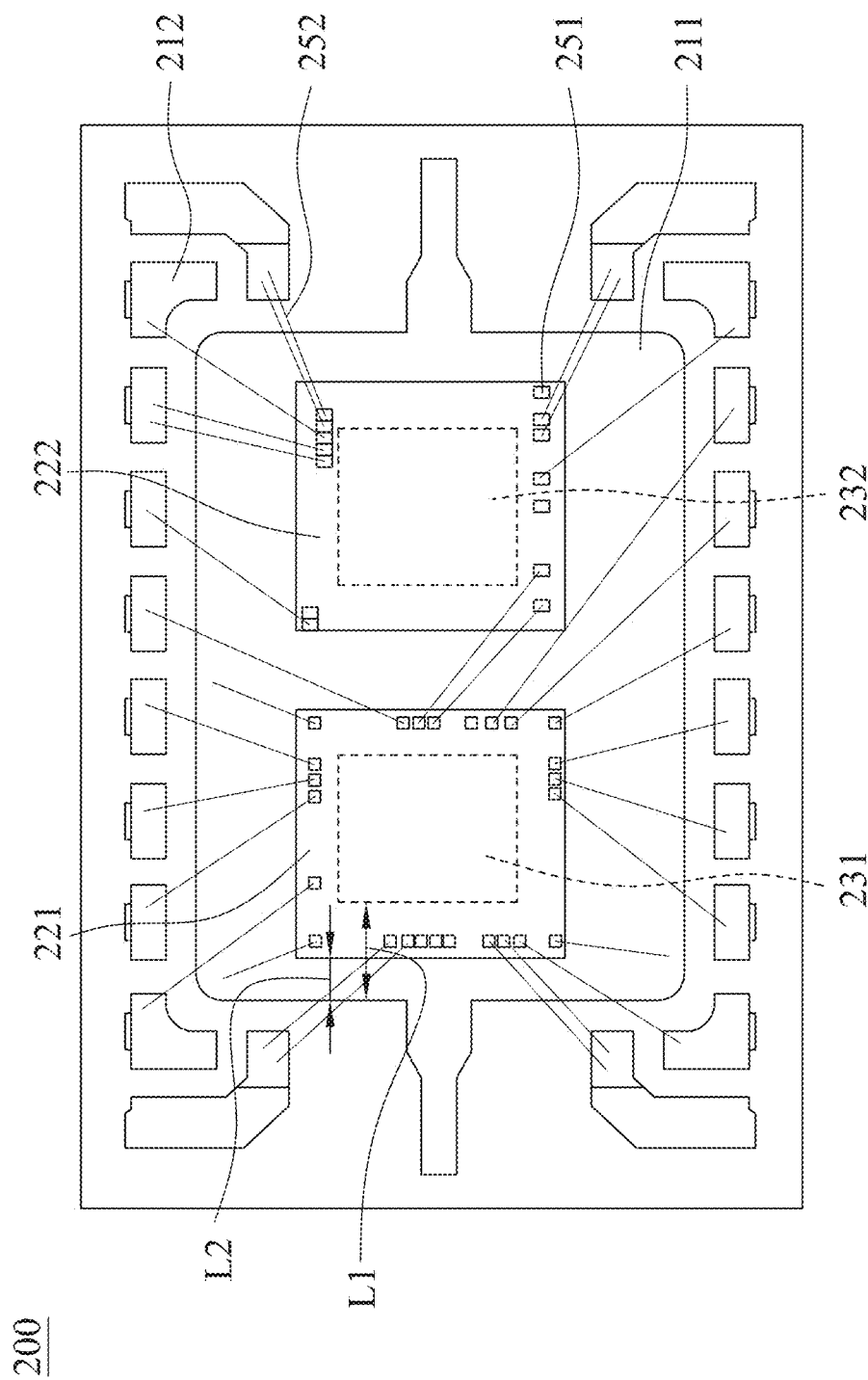
FIG. 3 is a plane schematic view of a package structure according to the 2nd embodiment of the present disclosure.
Figure 4:
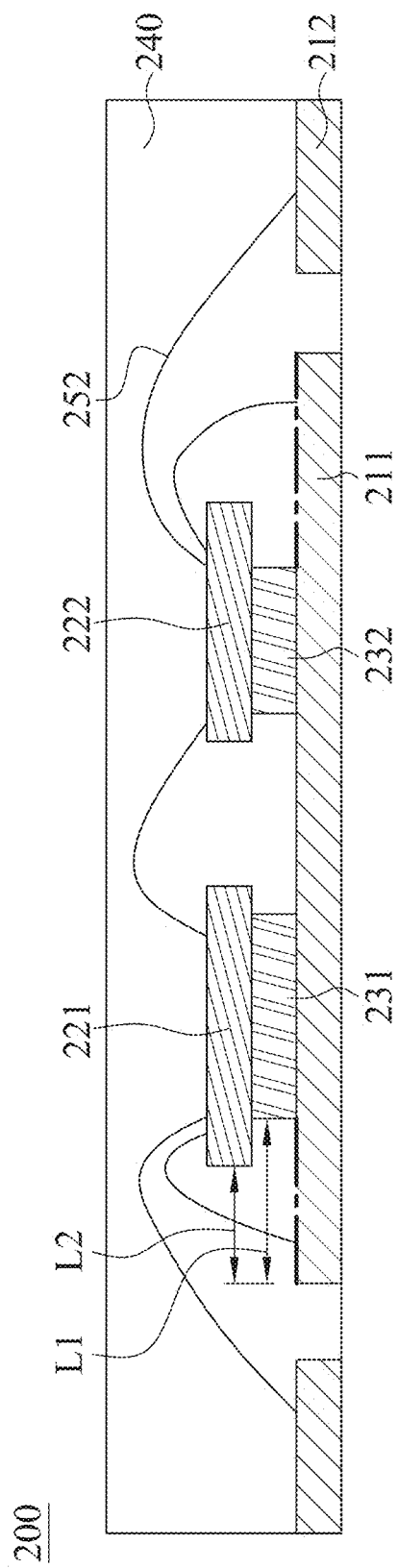
FIG. 4 is a cross-sectional view of the package structure according to the 2nd embodiment in FIG. 3.

FIG. 3 is a plane schematic view of a package structure 200 according to the 2nd embodiment of the present disclosure. FIG. 4 is a cross-sectional view of the package structure 200 according to the 2nd embodiment in FIG. 3. In FIGS. 3 and 4, the package structure 200 includes a leadframe (its reference numeral is omitted), two dies 221, 222, two spacers 231, 232 and a plastic package material 240, wherein the plastic package material 240 is disposed on the leadframe, and covers the dies 221, 222.

Furthermore, the leadframe includes a die pad 211 and a plurality of leads 212, and each of the dies 221, 222 includes a plurality of pads 251, wherein the dies 221, 222 are disposed on the die pad 211, a plurality of conducting wires 252 are connected to the leads 212 and the pads 251, the spacer 231 is disposed between the die 221 and the die pad 211, and the spacer 232 is disposed between the die 222 and the die pad 211.

A first minimum spacing distance L1 is between one of a plurality of edges of the spacers 231, 232 and one of a plurality of edges of the die pad 211, and a second minimum spacing distance L2 is between one of a plurality of edges of the dies 221, 222 and one of the edges of the die pad 211, wherein the first minimum spacing distance L1 is larger than the second minimum spacing distance L2. According to the 2nd embodiment, the first minimum spacing distance L1 is located between one of the edges of the spacer 231 and one of the edges of the die pad 211, the second minimum spacing distance L2 is located between one of the edges of the die 221 and one of the edges of the die pad 211. Therefore, when the dies 221, 222 are horizontally arranged on the die pad 211, the risk of the delamination of the plastic package material 240 under the stressed condition of the package structure 200 can be reduced by the sufficient contacting area between the plastic package material 240 and the die pad 211, wherein the contacting area which is increased via the spacers 231, 232 is shown as the thick chain line in FIG. 4.

Further, all of other structures and dispositions according to the 2th embodiment are the same as the structures and the dispositions according to the 1st embodiment, and will not be described again herein.

Figure 5:
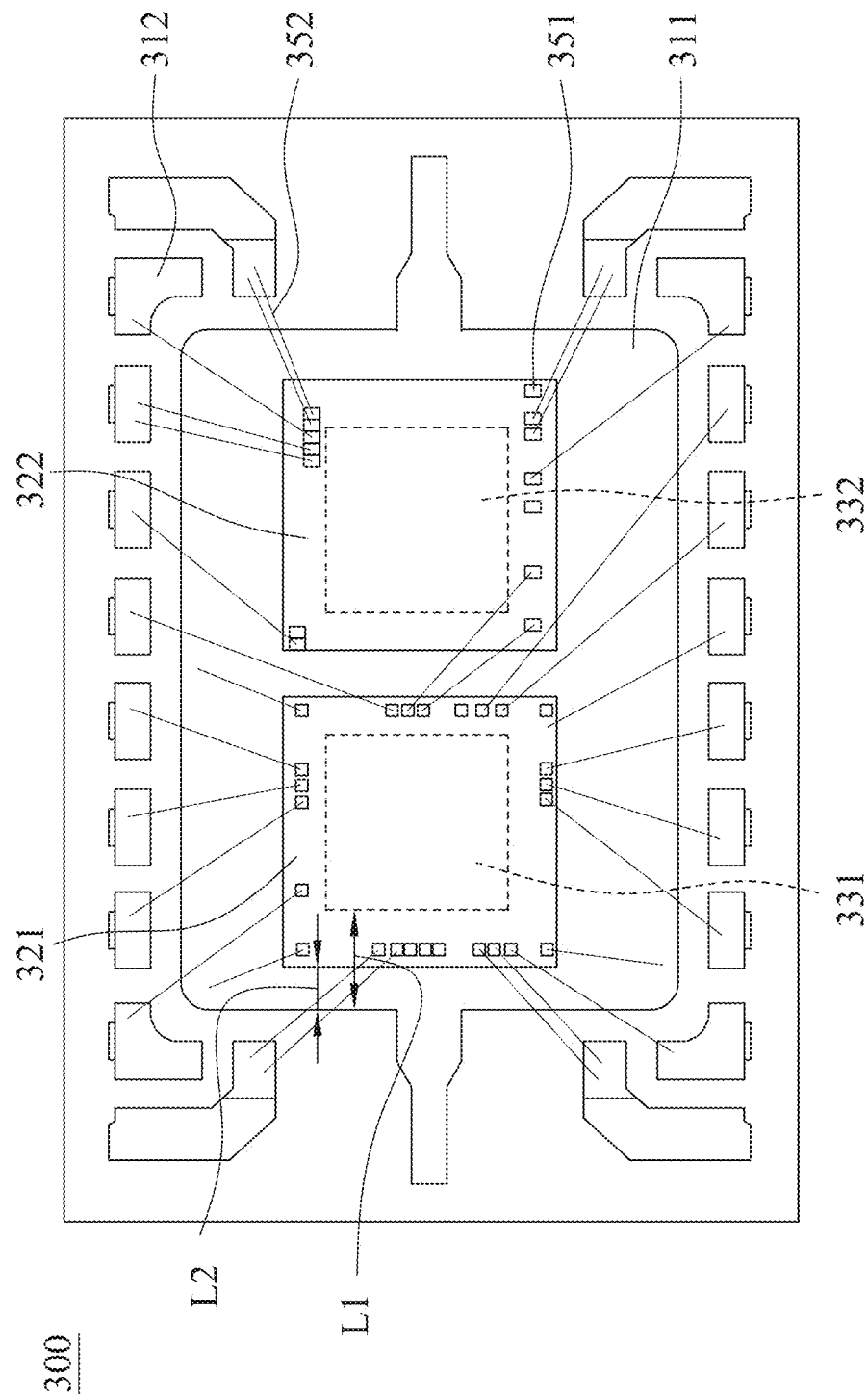
FIG. 5 is a plane schematic view of a package structure according to the 3rd embodiment of the present disclosure.
Figure 6:
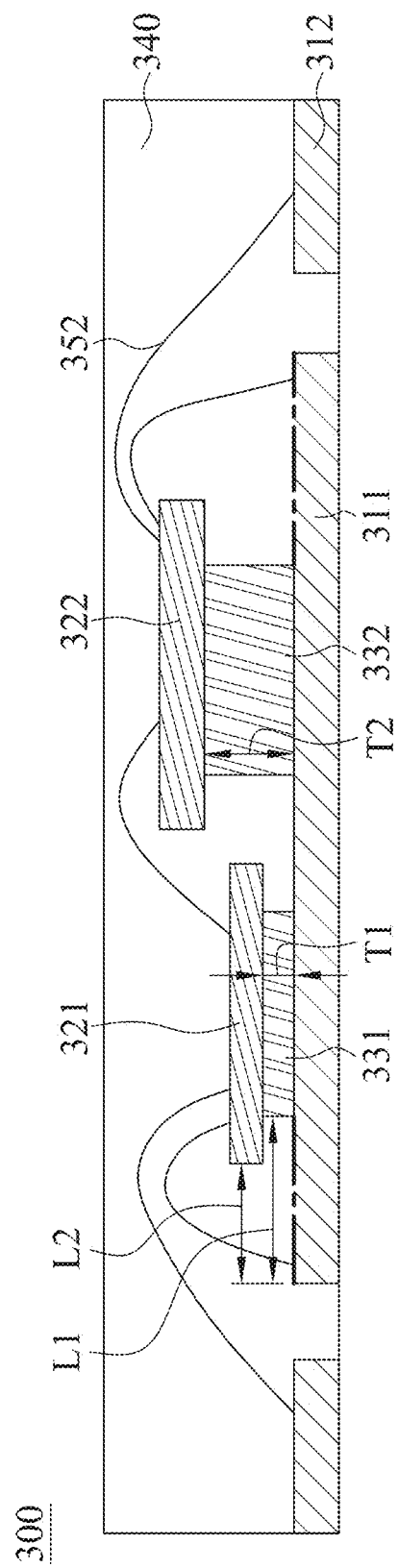
FIG. 6 is a cross-sectional view of the package structure according to the 3rd embodiment in FIG. 5.

FIG. 5 is a plane schematic view of a package structure 300 according to the 3rd embodiment of the present disclosure. FIG. 6 is a cross-sectional view of the package structure 300 according to the 3rd embodiment in FIG. 5. In FIGS. 5 and 6, the package structure 300 includes a leadframe (its reference numeral is omitted), two dies 321, 322, two spacers 331, 332 and a plastic package material 340, wherein the plastic package material 340 is disposed on the leadframe, and covers the dies 321, 322.

Furthermore, the leadframe includes a die pad 311 and a plurality of leads 312, and each of the dies 321, 322 includes a plurality of pads 351, wherein the dies 321, 322 are disposed on the die pad 311, a plurality of conducting wires 352 are connected to the leads 312 and the pads 351, the spacer 331 is disposed between the die 321 and the die pad 311, and the spacer 332 is disposed between the die 322 and the die pad 311.

A first minimum spacing distance L1 is between one of a plurality of edges of the spacers 331, 332 and one of a plurality of edges of the die pad 311, and a second minimum spacing distance L2 is between one of a plurality of edges of the dies 321, 322 and one of the edges of the die pad 311, wherein the first minimum spacing distance L1 is larger than the second minimum spacing distance L2. According to the 3rd embodiment, the first minimum spacing distance L1 is located between one of the edges of the spacer 331 and one of the edges of the die pad 311, the second minimum spacing distance L2 is located between one of the edges of the die 321 and one of the edges of the die pad 311. Therefore, when the dies 321, 322 are horizontally arranged on the die pad 311, the risk of the delamination of the plastic package material 340 under the stressed condition of the package structure 300 can be reduced by the sufficient contacting area between the plastic package material 340 and the die pad 311, wherein the contacting area which is increased via the spacers 331, 332 is shown as the thick chain line in FIG. 6.

Moreover, a thickness T1 of the spacer 331 is different from a thickness T2 of the spacer 332, wherein the thickness T1 is less than the thickness T2. When the total area of the dies 321, 322 is close to the area of the die pad 311, the vertical distance between the dies 321, 322 can be further enhanced via the spacers 331, 332 with the different thicknesses, so as to avoid the excessively close distance between the dies 321, 322 to cause the problem of the insufficient distance between the conductive wires 352. In detail, the horizontal distance between the dies 321, 322 can be shortened via the vertical distance between the dies 321, 322, so as to maintain the connecting strength of the conductive wires 352.

Further, all of other structures and dispositions according to the 3rd embodiment are the same as the structures and the dispositions according to the 1st embodiment, and will not be described again herein.

Figure 7:
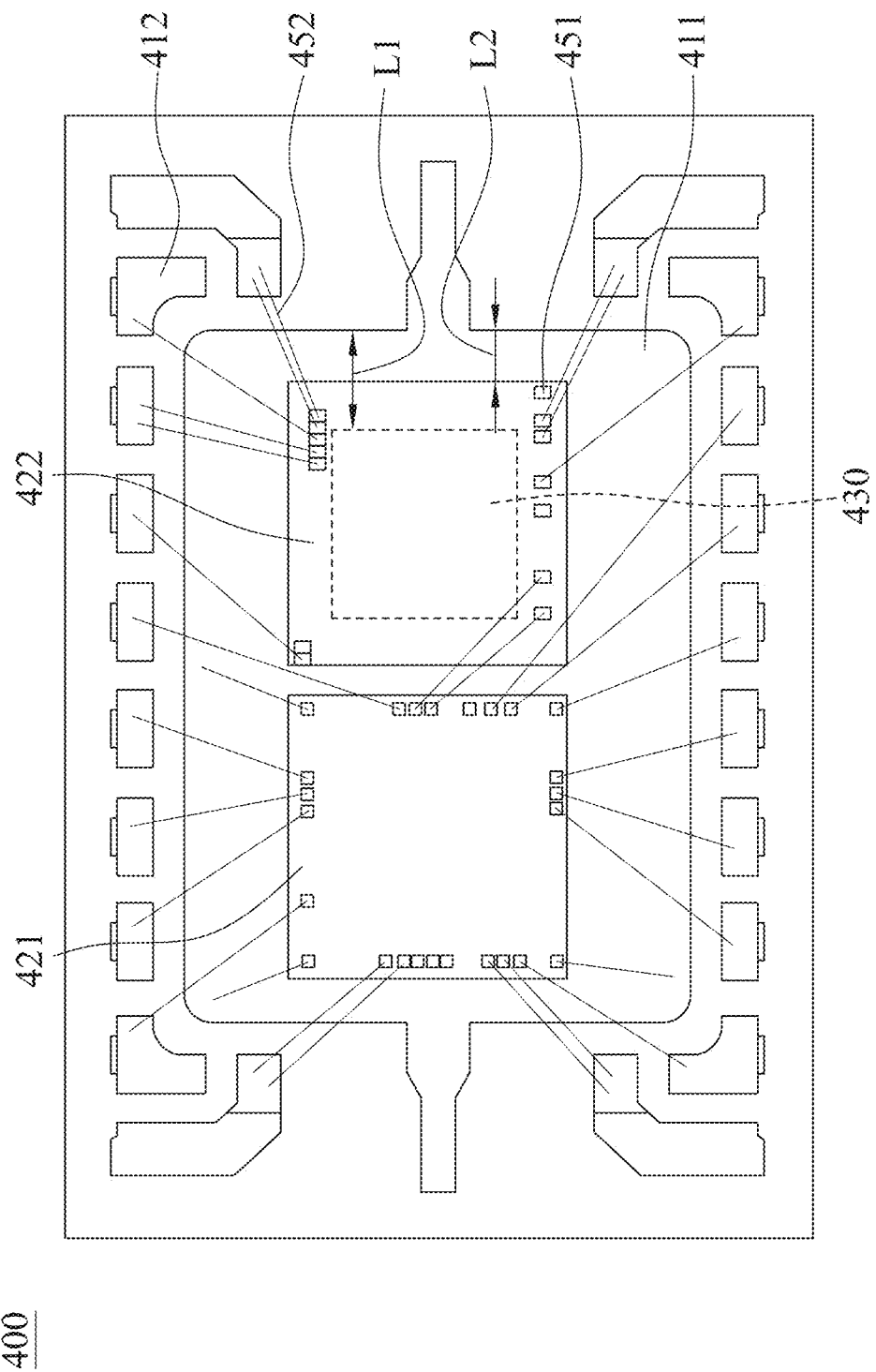
FIG. 7 is a plane schematic view of a package structure according to the 4th embodiment of the present disclosure.
Figure 8:
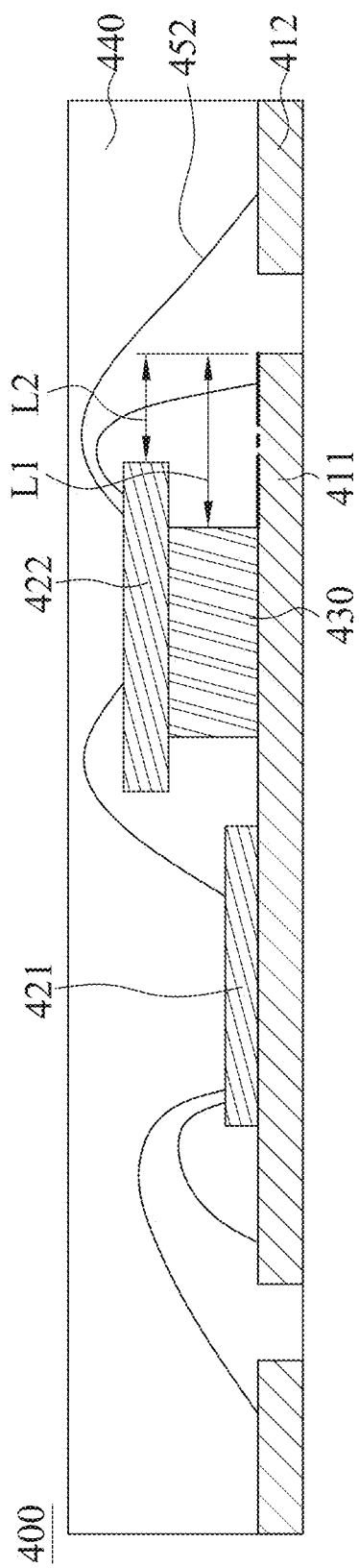
FIG. 8 is a cross-sectional view of the package structure according to the 4th embodiment in FIG. 7.

FIG. 7 is a plane schematic view of a package structure 400 according to the 4th embodiment of the present disclosure. FIG. 8 is a cross-sectional view of the package structure 400 according to the 4th embodiment in FIG. 7. In FIGS. 7 and 8, the package structure 400 includes a leadframe (its reference numeral is omitted), two dies 421, 422, a spacer 430 and a plastic package material 440, wherein the plastic package material 440 is disposed on the leadframe, and covers the dies 421, 422.

Furthermore, the leadframe includes a die pad 411 and a plurality of leads 412, and each of the dies 421, 422 includes a plurality of pads 451, wherein the dies 421, 422 are disposed on the die pad 411, a plurality of conducting wires 452 are connected to the leads 412 and the pads 451, and the spacer 430 is disposed between the die 422 and the die pad 411.

A first minimum spacing distance L1 is between one of a plurality of edges of the spacer 430 and one of a plurality of edges of the die pad 411, and a second minimum spacing distance L2 is between one of a plurality of edges of the dies 421, 422 and one of the edges of the die pad 411, wherein the first minimum spacing distance L1 is larger than the second minimum spacing distance L2. According to the 4th embodiment, the second minimum spacing distance L2 is located between one of the edges of the die 422 and one of the edges of the die pad 411. The vertical distance between the dies 421, 422 can be increased by disposing the spacer 430 between the die 422 and the die pad 411 and without disposing the spacer 430 between the die 421 and the die pad 411, so as to maintain the connecting strength of the conductive wires 452. Therefore, when the dies 421, 422 are horizontally arranged on the die pad 411, the risk of the delamination of the plastic package material 440 under the stressed condition of the package structure 400 can be reduced by the sufficient contacting area between the plastic package material 440 and the die pad 411, wherein the contacting area which is increased via the spacer 430 is shown as the thick chain line in FIG. 8.

Further, all of other structures and dispositions according to the 4th embodiment are the same as the structures and the dispositions according to the 1st embodiment, and will not be described again herein.

Figure 9:
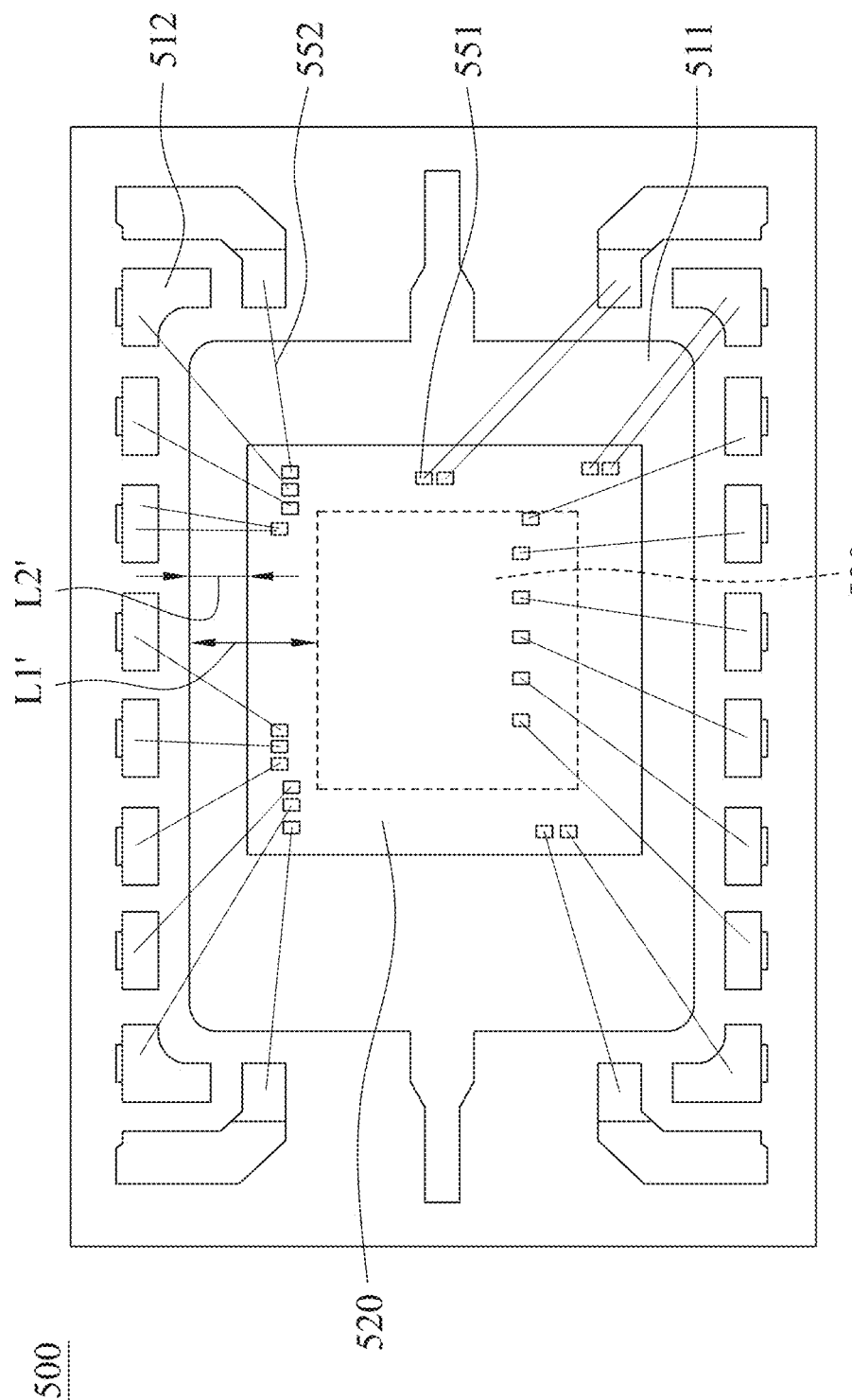
FIG. 9 is a plane schematic view of a package structure according to the 5th embodiment of the present disclosure.
Figure 10:
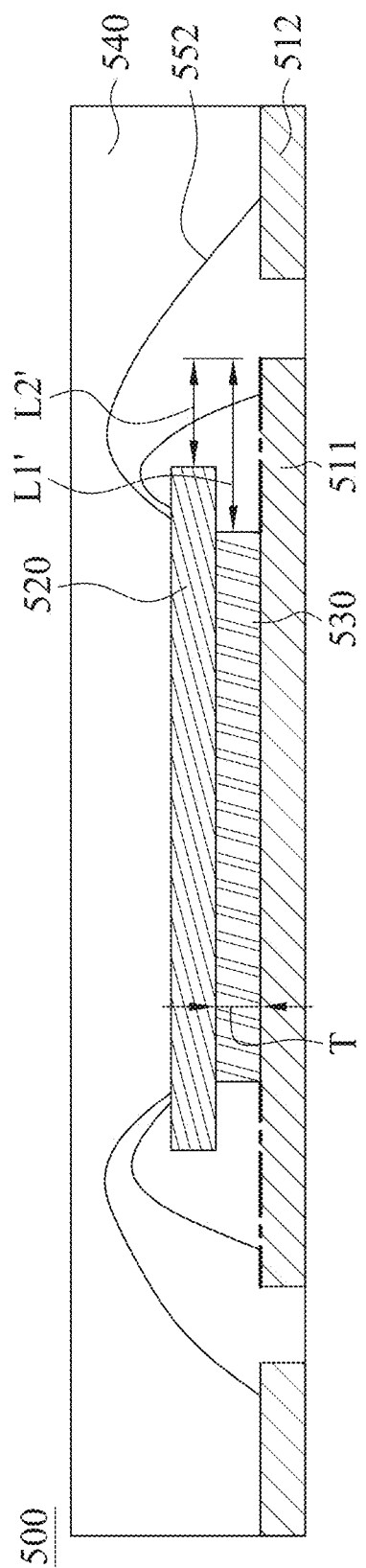
FIG. 10 is a cross-sectional view of the package structure according to the 5th embodiment in FIG. 9.

FIG. 9 is a plane schematic view of a package structure 500 according to the 5th embodiment of the present disclosure. FIG. 10 is a cross-sectional view of the package structure 500 according to the 5th embodiment in FIG. 9. In FIGS. 9 and 10, the package structure 500 includes a leadframe (its reference numeral is omitted), a die 520, a spacer 530 and a plastic package material 540, wherein the plastic package material 540 is disposed on the leadframe, and covers the die 520.

Moreover, the leadframe includes a die pad 511 and a plurality of leads 512, and the die 520 includes a plurality of pads 551, wherein the die 520 is disposed on the die pad 511, a plurality of conducting wires 552 are connected to the leads 512 and the pads 551, and the spacer 530 is disposed between the die 520 and the die pad 511.

An area of the spacer 530 is less than an area of the die 520. Furthermore, a first minimum spacing distance L1' is between one of a plurality of edges of the spacer 530 and one of a plurality of edges of the die pad 511, a second minimum spacing distance L2' is between one of a plurality of edges of the die 520 and one of the edges of the die pad 511, the first minimum spacing distance L1' is larger than the second minimum spacing distance L2', and the first minimum spacing distance L1' can be at least 40 micrometers.

Figure 11:
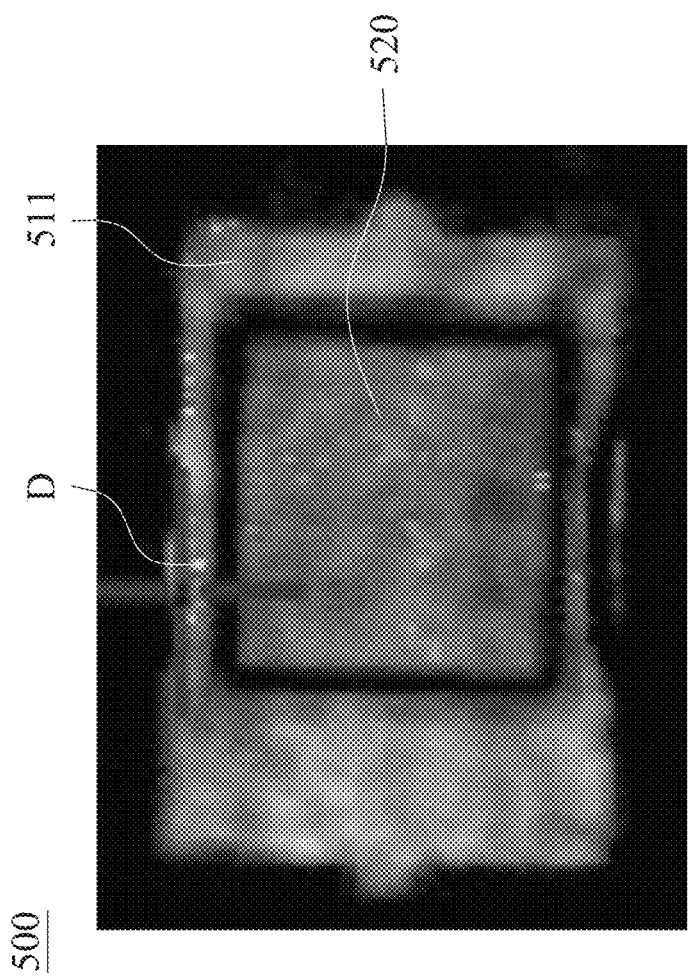
FIG. 11 is an analyzing image of the scanning acoustic tomography (SAT) of the package structure according to the 5th embodiment in FIG. 9.

FIG. 11 is an analyzing image of the scanning acoustic tomography (SAT) of the package structure 500 according to the 5th embodiment in FIG. 9. In particular, when an area of the die 520 is similar to an area of the die pad 511, a contacting area between the plastic package material 540 and the die pad 511 can be increased via the spacer 530, that is, the risk of the delamination of the plastic package material 540 under the stressed condition of the package structure 500 can be reduced by the sufficient contacting area between the plastic package material 540 and the die pad 511. In FIG. 11, the delamination is hardly visible by analyzing via the scanning acoustic tomography, wherein the delamination portion D is sporadically scattered on a side of the die pad 511. Further, the contacting area which is increased via the spacer 530 is shown as the thick chain line in FIG. 10.

Moreover, the disposing flexibility of the die 520 can be increased via the spacer 530, that is, the disposition of the die 520 is not limited to the area of the die pad 511, so as to increase the flexibility of design of the package structure 500, especially the condition that the larger area of the die is disposed on the smaller volume of the package structure. Moreover, the effect of protecting the die 520 can be obtained via the spacer 530, so as to avoid the damaging condition of the die 520 during the external stress striking the package structure 500.

In detail, a thickness T of the spacer 530 can be larger than or equal to 40 micrometers, and less than or equal to 500 micrometers. When the thickness T of the spacer 530 is less than the aforementioned value range, the effect of obtaining the sufficient contacting area between the plastic package material 540 and the die pad 511 cannot achieved via the spacer 530; when the thickness T of the spacer 530 is larger than the aforementioned value range, the problem of over the standard thickness of the package structure 500 may be caused, or the risk of the conducting wires 552 excessively close to the surface of the plastic package material 540 may be caused.

The spacer 530 can be made of silicon. In particular, the spacer 530 can be the blank wafer made of silicon, but the present disclosure is not limited thereto.

It should be mentioned that the indication of the plastic package material is omitted in FIGS. 1, 3, 5, 7, 9 and 11 for clearly describing the disposition of another elements, such as the leadframe, the dies and the spacers.

In summary, whether the single-die package structure or the multi-die package structure, the risk of the delamination of the plastic package material under the stressed condition of the package structure can be reduced by the sufficient contacting area between the plastic package material and the die pad via the spacer. Also, the disposing flexibility of the die or the dies can be increased via the spacer for the single-die package structure or the multi-die package structure, that is, the disposition of the die or the dies is not limited to the area of the die pad, so as to increase the flexibility of design of the package structure. Further, the effect of protecting the die or the dies can be obtained via the spacer, so as to avoid the damaging condition of the die or the dies during the external stress striking the package structure.

The foregoing description, for purpose of explanation, has been described with reference to specific examples. It is to be noted that Tables show different data of the different examples; however, the data of the different examples are obtained from experiments. The examples were chosen and described in order to best explain the principles of the disclosure and its practical applications, to thereby enable others skilled in the art to best utilize the disclosure and various examples with various modifications as are suited to the particular use contemplated. The examples depicted above and the appended drawings are exemplary and are not intended to be exhaustive or to limit the scope of the present disclosure to the precise forms disclosed. Many modifications and variations are possible in view of the above teachings.

What is claimed is:
1. A package structure, comprising:
a leadframe, comprising:
a die pad;
at least two dies disposed on the die pad of the leadframe;
at least one spacer disposed between at least one of the at least two dies and the die pad; and a plastic package material disposed on the leadframe, and covering the at least two dies;

wherein a first minimum spacing distance is between one of a plurality of edges of the at least one spacer and one of a plurality of edges of the die pad, a second minimum spacing distance is between one of a plurality of edges of the at least two dies and the one of the edges of the die pad, and the first minimum spacing distance is larger than the second minimum spacing distance;

wherein a number of the least one spacer is at least two, and a thickness of one of the at least two spacers is different from a thickness of the other one of the at least two spacers.

2. The package structure of claim 1, wherein the first minimum spacing distance is at least 40 micrometers.

3. The package structure of claim 1, wherein each of the spacers is disposed between each of the dies and the die pad.

4. The package structure of claim 1, wherein the thickness of each of the spacers is larger than or equal to 40 micrometers, and less than or equal to 500 micrometers.

5. The package structure of claim 1, wherein each of the spacers is made of silicon.

6. The package structure of claim 1, wherein an area of one of the at least two dies is different from an area of the other one of the at least two dies.

7. The package structure of claim 1, wherein a total area of the at least two spacers is less than a total area of the at least two dies.

* * * * *